(12) United States Patent
Nakayama et al.

(10) Patent No.: US 7,795,630 B2
(45) Date of Patent: Sep. 14, 2010

(54) SEMICONDUCTOR DEVICE WITH OXIDIZED REGIONS AND METHOD FOR FABRICATING THE SAME

(75) Inventors: Hisashi Nakayama, Kyoto (JP); Tetsuzo Ueda, Osaka (JP); Masaaki Yuri, Osaka (JP); Toshiyuki Takizawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/912,142

(22) Filed: Aug. 6, 2004

(65) Prior Publication Data
US 2005/0029531 A1 Feb. 10, 2005

(30) Foreign Application Priority Data
Aug. 7, 2003 (JP) .............................. 2003-288750

(51) Int. Cl.
*H01L 33/00* (2010.01)
(52) U.S. Cl. ...................... 257/94; 257/79; 257/184; 257/192; 257/E33.011; 257/E33.025; 257/E33.028; 257/E33.03; 257/E33.033; 257/E33.034
(58) Field of Classification Search .................. 257/79, 257/94, 98, 192, 184, E33.011, 194, E33.025, 257/E33.028, E33.03, E33.033, E33.034; 372/46.013
See application file for complete search history.

(56) References Cited

U.S. PATENT DOCUMENTS

| | | | | |
|---|---|---|---|---|
| 5,821,569 A | * | 10/1998 | Dutta | 257/96 |
| 5,889,295 A | * | 3/1999 | Rennie et al. | 257/96 |
| 6,225,650 B1 | * | 5/2001 | Tadatomo et al. | 257/190 |
| 6,261,859 B1 | | 7/2001 | Ouchi | |
| 6,306,672 B1 | | 10/2001 | Kim | |
| 6,770,922 B2 | * | 8/2004 | Inoue et al. | 257/289 |
| 6,890,785 B2 | * | 5/2005 | Goto et al. | 438/46 |
| 7,091,524 B2 | * | 8/2006 | Nakayama et al. | 257/94 |
| 2002/0125471 A1 | * | 9/2002 | Fitzgerald et al. | 257/19 |
| 2002/0137249 A1 | * | 9/2002 | Ishida et al. | 438/47 |
| 2002/0173064 A1 | * | 11/2002 | Ogawa et al. | 438/46 |
| 2003/0052326 A1 | | 3/2003 | Ueda et al. | |
| 2003/0186475 A1 | * | 10/2003 | Ueda et al. | 438/22 |
| 2003/0205721 A1 | * | 11/2003 | Nishii et al. | 257/194 |

FOREIGN PATENT DOCUMENTS

| | | |
|---|---|---|
| JP | 2001-026755 | 1/2001 |
| JP | 2001-267555 | 9/2001 |
| JP | 2003-163417 A | 6/2003 |

OTHER PUBLICATIONS

English Language Abstract of JP 2001-267555.
English Language Abstract of JP 2001-026755.
Notice of Reasons for Rejection in counterpart Japanese Application No. 2004-226898 dated May 11, 2010.
English translation of Notice of Reasons for Rejection in counterpart Japanese Application No. 2004-226898 dated May 11, 2010.

* cited by examiner

*Primary Examiner*—Kenneth A Parker
*Assistant Examiner*—Jay C Kim
(74) *Attorney, Agent, or Firm*—Greenblum & Bernstein, P.L.C.

(57) ABSTRACT

A semiconductor device, which includes an active layer made of a first semiconductor layer formed on a substrate, is designed so that a first oxidized area made of an oxide layer is formed on the active layer. The first oxidized area further aids in reducing a reactive current so that it becomes possible to achieve a semiconductor device having superior device characteristics.

5 Claims, 10 Drawing Sheets

SEMICONDUCTOR DEVICE WITH OXIDIZED REGIONS AND METHOD FOR FABRICATING THE SAME

CROSS-REFERENCES TO RELATED APPLICATION

This application is related to Japanese Patent Application No. 2003-288750, filed on Aug. 7, 2003, the disclosures in the specification, drawings and claims of which are incorporated by reference in their entirety.

BACKGROUND OF THE INVENTION

The present invention relates to a light-emitting element, such as a light-emitting diode and a semiconductor laser element, that emits light in a bluish purple range or an ultraviolet range, or a semiconductor device such as a transistor that is operated in the order of the GHz, and also concerns a fabricating method for such a device.

A nitride semiconductor, which is indicated by a general formula, $B_xAl_yGa_{1-y-z}In_zN$ ($0=x=1$, $0=y=1$, $0=z=1$), is a semiconductor that exerts a great wide-bandgap energy, that is, a bandgap energy of 3.4 eV (at room temperature) in the case of GaN; therefore, this semiconductor is expected as a material that can realize visible-range light emission in a wide area ranging from blue to ultraviolet. Moreover, since this semiconductor exerts a large electron velocity in the high electrical field, it is also expected as a material for a high-temperature operative and high-output transistor.

Conventionally, since the nitride semiconductor generally has a high growth temperature and since no substrate material that lattice-matches therewith is available, a nitride semiconductor having a desirable crystal was not obtained. However, since a technique in which a nitride semiconductor is grown on a sapphire substrate through a low-temperature buffer layer by using an MOCVD method has been developed, its crystallinity is improved so that light-emitting diodes and semiconductor lasers using this material have been commercialized. In general, in the GaN crystal formed on a sapphire substrate, there are crystal defects having a size of about $1 \times 10^9$ cm$^{-2}$; however, in a blue-light emitting device using InGaN as a light-emitting layer, since carriers are located biasly due to unevenness in the In composition, blue-light emission is available even when its crystal defect density is high.

However, since the crystal defect acts as a non-radiative recombination center of carriers, the light-emitting efficiency is lowered to cause degradation in the reliability of the light-emitting element. In order to solve this problem, a crystal-defect reducing technique utilizing growth in the lateral direction (Epitaxial Lateral Overgrowth) has been developed. For example, GaN is allowed to laterally grow on a mask such as a SiO$_2$ film or after a step difference has been formed on a substrate, GaN is allowed to laterally grow on the step difference so that the crystal defect density can be reduced to about $1 \times 10^7$ cm$^{-2}$.

In this manner, by reducing the crystal defect density of a nitride semiconductor, the nitride semiconductor device is greatly improved in its characteristics so that various researches and developments for reduction in crystal defects have been actively carried out.

Moreover, in addition to the crystal-defect reducing technique, another technique, which has drawn public attention as a performance-improving method for nitride semiconductor devices, is a selective oxidizing technique for the nitride semiconductor surface. For example, an oxide layer is formed on a GaN surface by carrying out a thermal process in an oxygen atmosphere using an Si thin film or the like as a mask material, and the mask material is then removed. When a field-effect transistor is further formed on the GaN surface, the oxide layer formed on the GaN surface allows element separation of the device and provides high pressure resistance to the device (for example, see Japanese Patent Application Laid-Open No. 2001-26755). This selective oxidizing technique can be applied to current constriction of a semiconductor laser, and is expected to be used in a wide range of applications.

Here, in the ultraviolet light-emitting device, AlGaN, which is transparent to ultraviolet rays, needs to be used as a base member. In this case, when GaN is allowed to grow laterally by using a SiO$_2$ film as a mask, polycrystal is deposited on the SiO$_2$ film, with the result that GaN is not selectively grown, making it difficult to reduce crystal defects.

Moreover, since a mixed crystal of AlGaN without containing In is used as an activator layer of an ultraviolet light-emitting device, localization of carriers occurs only in a small level. For this reason, a reactive current flowing through the crystal defect appears conspicuously, resulting in a low light-emitting efficiency.

Furthermore, in general, the manufacturing processes of the device include processes in which a step difference is formed by using dry etching so that electrodes are formed on the step difference in most cases. Consequently, on an interface formed through these processes, the reactive current flowing through etching damages increases, causing degradation in the element characteristics.

SUMMARY OF THE INVENTION

The present invention has been devised to solve the above-mentioned problems, and its objective is to provide a semiconductor device that achieves superior element characteristics and a fabricating method for such a semiconductor device.

In order to achieve the objective, a first semiconductor device in accordance with the present invention, which is a semiconductor device having an active layer made of a first semiconductor layer formed on a substrate, is characterized in that a first oxidized area made of an oxide layer is formed on the active layer.

In accordance with the first semiconductor device of the present invention, the oxide layer, formed on the active layer, functions as a current blocking layer so that a reactive current is prevented from flowing through the active layer; thus, it becomes possible to achieve a semiconductor device having superior device characteristics.

In the first semiconductor device of the present invention, the first oxidized area is preferably formed in the vicinity of each crystal defect that is present in the active layer.

With this arrangement, the crystal defects that are present in the active layer are selectively covered with the oxide layer so that a reactive current, which flows through the crystal defect serving as a non-radiative recombination center, is selectively inhibited. Therefore, it becomes possible to achieve a semiconductor device having superior device characteristics.

The first semiconductor device relating to the present invention is preferably further provided with a second semiconductor layer formed on the active layer, and a second oxidized area, made of an oxide layer, is preferably formed on at least one of the surface and the side face of the second semiconductor layer.

With this arrangement, a reactive current flowing through the surface of the second semiconductor layer is inhibited, and since the side face of the second semiconductor layer that has been etched through dry etching or the like is covered with the oxide layer, a reactive current flowing through the side face having etching damages can be inhibited; thus, it becomes possible to greatly improve device characteristics of the semiconductor device.

In the first semiconductor device relating to the present invention, the layer thickness of the second oxidized area formed on the side face of the second semiconductor layer is preferably made greater than the layer thickness of the second oxidized area formed in the vicinity of the surface of the second semiconductor layer.

As described above, since the surface of the semiconductor layer is selectively covered with the oxide layer, it becomes possible to greatly improve device characteristics of the semiconductor device.

In the first semiconductor device relating to the present invention, the first oxidized area is further formed on the side face of the active layer, and the layer thickness of the first oxidized area formed on the side face of the active layer is preferably made greater than the layer thickness of the second oxidized area formed on the side face of the second semiconductor layer.

In this manner, since the side face of the semiconductor layer is selectively covered with the oxide layer, it is possible to greatly improve device characteristics of the semiconductor device.

A second semiconductor device in accordance with the present invention, which is a semiconductor device having an active layer made of a first semiconductor layer formed on a substrate and a second semiconductor layer formed on the active layer, is characterized in that a first oxidized area made of an oxide layer is formed on the active layer.

In accordance with the second semiconductor device of the present invention, since the second semiconductor layer is not oxidized, with an oxide layer being formed only on the active layer, it is possible to reduce a voltage rise due to the oxide layer, and consequently to achieve a semiconductor device having superior device characteristics.

In the first or second semiconductor device relating to the present invention, the active layer is preferably made of an activator layer of a light-emitting diode.

In the first or second semiconductor device relating to the present invention, the active layer is preferably made of a light-absorbing layer of a photodiode.

In the first or second semiconductor device relating to the present invention, the active layer is preferably made of an activator layer of a semiconductor laser.

In the first or second semiconductor device relating to the present invention, the active layer is preferably made of a channel layer of a field-effect transistor.

A first fabricating method for a semiconductor device of the present invention is provided with a step of forming an active layer made of a semiconductor layer on a substrate and a step of selectively forming an oxidized area made of an oxide layer on the active layer.

In accordance with the first fabricating method for a semiconductor device relating to the present invention, since the oxide layer, selectively formed on the active layer, functions as a current-blocking layer so that a conductor device having superior device characteristics can be fabricated without the necessity of subjecting the base layer to crystal-defect reducing processes.

In the first fabricating method for a semiconductor device of the present invention, the step of selectively forming the oxidized area preferably includes a step of forming an oxidized area in the vicinity of a crystal defect that is present in the active layer.

With this arrangement, since a reactive current flowing through a crystal defect that acts as a non-radiative recombination center can be inhibited so that it is possible to fabricate a semiconductor device having superior device characteristics.

In the first fabricating method for a semiconductor device relating to the present invention, the step of selectively forming the oxidized area preferably includes a step of forming an oxidized area through a thermal treatment in an atmosphere containing water vapor.

With this method, the oxide layer, formed on the active layer is made thicker in an area containing crystal defects in comparison with an oxide layer made through an oxygen-oxidizing process; therefore, the function of the current-blocking layer by the oxide layer is exerted more effectively so that it becomes possible to fabricate a semiconductor device having superior device characteristics.

A second fabricating method for the semiconductor device of the present invention is provided with a step of forming an active layer made of a first semiconductor layer on a substrate, a step of forming a second semiconductor layer on the active layer, and a step of selectively forming oxidized areas made of oxide layers on at least two faces having different face orientations in the second semiconductor layer.

In accordance with the second fabricating method for a semiconductor device relating to the present invention, since a reactive current flowing through a face that has been etched by, for example, dry etching and has the subsequent etching damage can be prevented, it becomes possible to greatly improve device characteristics of the semiconductor device without the necessity of subjecting the base layer to crystal-defect reducing processes.

In the second fabricating method for a semiconductor device of the present invention, the step of selectively forming the oxidized area preferably includes a step of forming oxidized areas so that oxidized areas to be formed on at least the respective two faces have respectively different layer thicknesses.

In this manner, since the oxide layers having different thicknesses are selectively formed on the surfaces of the semiconductor layer, it becomes possible to greatly improve device characteristics of the semiconductor device.

In the second fabricating method for a semiconductor device, at least one of the two faces is preferably formed as a face having a c-face orientation in the second semiconductor layer.

With this arrangement, a reactive current to flow through the c-face (main face) can be inhibited. Thus, it becomes possible to fabricate a semiconductor device having superior device characteristics.

In the second fabricating method for a semiconductor device of the present invention, the layer thickness of the oxidized area to be formed on the face having the c-face orientation in the second semiconductor layer is preferably made smaller than the layer thickness of the oxidized area to be formed on a face different from the face having the c-face orientation in the second semiconductor layer.

With this arrangement, a reactive current flowing through the face different from the c-face (main face) of the semiconductor layer can be prevented. Thus, it becomes possible to fabricate a semiconductor device having superior device characteristics.

BRIEF DESCRIPTION OF THE DRAWINGS

FIG. 1A is a plan view and FIG. 1B is a cross-sectional view taken along line Ib-Ib thereof.

FIG. 5A is a plan view and FIG. 5B is a cross-sectional view taken along line Vb-Vb thereof.

FIG. 6A is a plan view, and FIG. 6B is a cross-sectional view taken along line VIb-VIb thereof.

FIG. 7A is a plan view and FIG. 7B is a cross-sectional view taken along line VIIb-VIIb thereof.

FIG. 11A is a plan view and FIG. 11B is a cross-sectional view taken along line XIb-XIb thereof.

DETAILED DESCRIPTION OF THE INVENTION

Referring to Figures, the following description will discuss embodiments of the present invention.

First Embodiment

The following description discusses a semiconductor device in accordance with the first embodiment of the present invention and a fabricating method for such a semiconductor device.

First, the semiconductor device of the first embodiment of the present invention is explained by exemplifying a light-emitting diode.

Figure 1A:
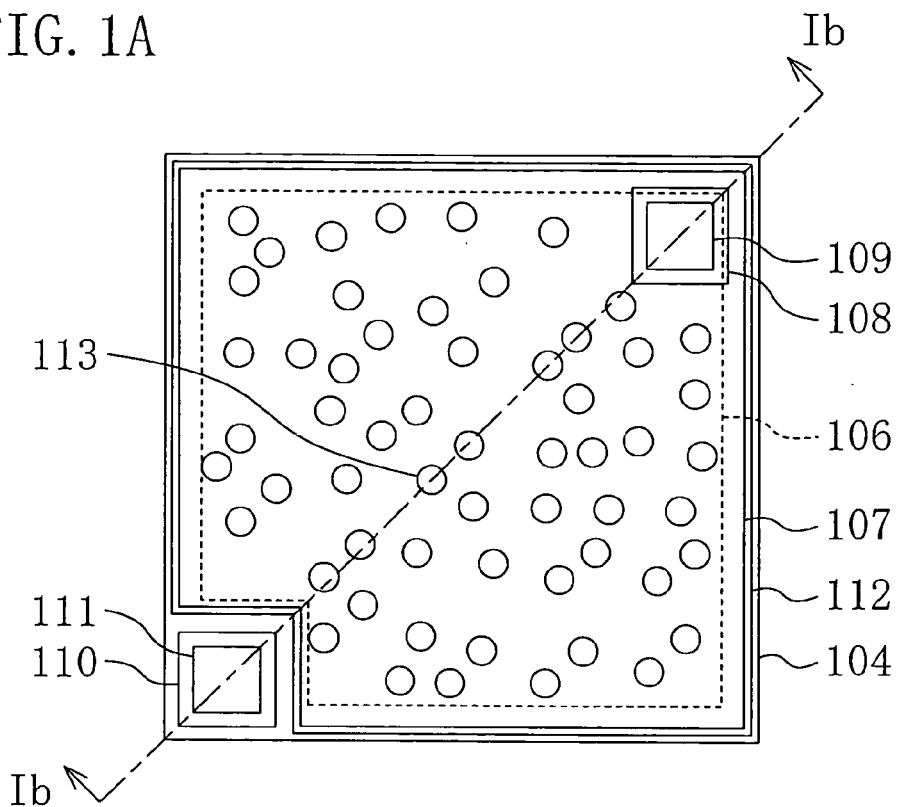
FIGS. 1A and 1B are drawings that show a light-emitting diode in accordance with a first embodiment of the present invention.
Figure 1B:
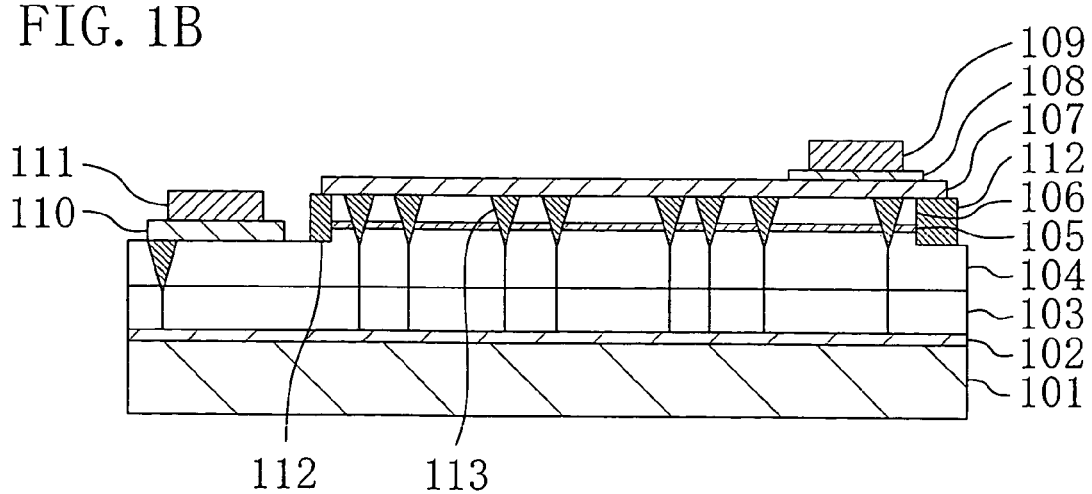

FIGS. 1A and 1B are drawings that show the light-emitting diode in accordance with the first embodiment of the present invention; FIG. 1A is a plan view and FIG. 1B is a cross-sectional view taken along line Ib-Ib of FIG. 1A.

As shown in FIGS. 1A and 1B, on a sapphire substrate 101, a buffer layer 102 made from AlN or GaN, an undoped layer 103 made from a mixed crystal of AlGaN, an n-type clad layer 104 made from a mixed crystal of AlGaN, an activator layer 105 made of an AlGaN/AlGaN laminated film and a p-type clad layer 106 made from AlGaN are stacked in succession from the bottom. A p-type transparent electrode 107 is formed on the entire surface of the p-type clad layer 106, and an electrode pad 109 is formed on one corner of the p-type transparent electrode 107 through a p-type electrode 108. Moreover, the p-type clad layer 106 the activator layer 105 and the n-type clad layer 104 are etched through dry etching to form step differences; thus, on the n-type clad layer 104 that is located diagonally to the electrode pad 109 to form a step difference, an n-type electrode 110 and an electrode pad 111 are formed in succession from the bottom.

Here, with respect to the n-type clad layer 104 and the p-type clad layer 106, Si and Mg are respectively used as dopants, and the respective carrier densities of the n-type clad layer 104 and the p-type clad layer 106 are $2 \times 10^{18}$ cm$^{-3}$ and $5 \times 10^{17}$ cm$^{-3}$.

Moreover, the following {Table 1} shows one example of compositions and layer thicknesses of the respective layers constituting the light-emitting diode in accordance with the first embodiment.

TABLE 1

| Layer Name | Composition | Layer thickness |
|---|---|---|
| Electrode pad 111 | Au | 4 μm |
| n-type electrode 110 | Ti/ | 5 nm/ |
|  | Al/ | 100 nm/ |
|  | Pt/ | 10 nm/ |
|  | Au | 200 nm |
| Electrode pad 109 | Au | 4 μm |
| p-type electrode 108 | Ni/ | 5 nm/ |
|  | Au | 200 nm |
| p-type transparent electrode 107 | ITO (Indium Tin Oxide) | 30 nm |
| p-type clad layer 106 | p-type Al$_{0.25}$Ga$_{0.75}$N | 30 nm |
| Activator layer 105 | Al$_{0.25}$Ga$_{0.75}$n (Barrier layer) / Al$_{0.15}$Ga$_{0.85}$N (Well layer) / (× 3 cycle) ⋮ Al$_{0.25}$Ga$_{0.75}$N (Barrier layer) | 5 nm 2 nm 6 nm |
| n-type clad layer 104 | n-type Al$_{0.25}$Ga$_{0.75}$N clad layer | 500 nm |
| Undoped layer 103 | Undoped Al$_{0.25}$Ga$_{0.75}$N layer | 1 μm |
| Buffer layer 102 | AlN.GaN buffer layer | 40 nm |

Here, as shown in FIGS. 1A and 1B, crystal defects penetrate the undoped layer 103, the n-type clad layer 104 the activator layer 105 and the p-type clad layer 106, with a crystal-defect density being set to about $5 \times 10^9$ cm$^{-2}$. At portions in which the crystal defects reach the upper surface of the p-type clad layer 106 oxide films 113 which have been oxidized deeply at areas having the crystal defects, are formed. The depth of each of oxide films 113 that have been oxidized deeply at the areas having crystal defects is, for example, 50 nm so that the crystal defect is oxidized in such a depth as to penetrate the activator layer 105. Moreover, areas having no crystal defect are thinly oxidized with a thickness of the oxidized film being set to, for example, 20 nm.

In this case, each oxide film 113 that has been oxidized deeply at the area having a crystal defect is formed by processes in which, after oxidizing the p-type clad layer 106 by using a gas containing water vapor, the resulting thin oxide film formed on the surface thereof is removed. At each step difference that reaches the n-type clad layer 104 through dry etching, an oxide film 112 thickly oxidized is formed on the side faces of the n-type clad layer 104 the activator layer 105 and the p-type clad layer 106 that constitute the step difference. With this structure, current leak is prevented on the side faces of the n-type clad layer 104 the activator layer 105 and the p-type clad layer 106. Here, the thickness of the oxide film 112 is set to, for example, 100 nm.

The oxide film 112 formed on the side faces of the n-type clad layer 104 the activator layer 105 and the p-type clad layer 106 and each oxide film 113 that has been oxidized deeply at the area having a crystal defect are insulating members so that it is possible to prevent leak current flowing through the side faces of the n-type clad layer 104 the activator layer 105 and the p-type clad layer 106 and a non-radiative current that flows through the crystal defect. With this structure, the current is selectively injected to the light-emitting area without crystal defects so that it becomes possible to achieve a light-emitting diode having high efficiency.

Referring to FIGS. 2A to 2D, the following description will discuss a fabricating method for the above-mentioned ultraviolet light-emitting diode as one example of the fabricating method for the semiconductor device in accordance with the first embodiment of the present invention.

FIGS. 2A to 2D are cross-sectional views that show main processes of the fabricating method for the ultraviolet light-emitting diode in accordance with the first embodiment of the present invention.

Figure 2A:
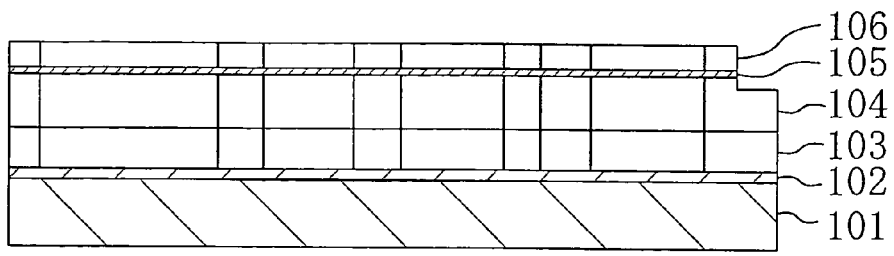
FIGS. 2A to 2D are cross-sectional views of processes that show a fabricating method for the light-emitting diode in accordance with the first embodiment of the present invention.

First, as shown in FIG. 2A, on a sapphire substrate 101, a buffer layer 102 made from AlN or GaN, an undoped layer 103 made from a mixed crystal of AlGaN, an n-type clad layer 104 made from a mixed crystal of AlGaN, an activator layer 105 made of an AlGaN/AlGaN laminated film and a p-type clad layer 106 made from AlGaN are stacked in succession from the bottom by using the MOCVD method.

Figure 2B:
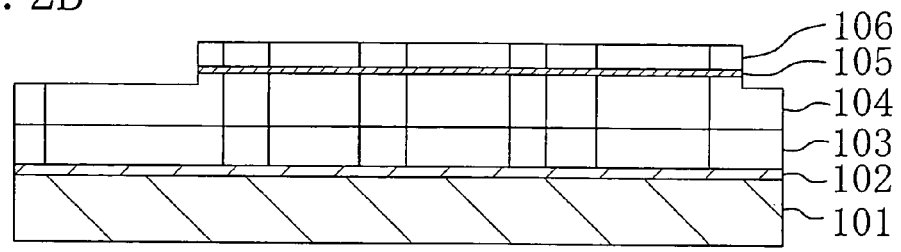

Next, as shown in FIG. 2B, the p-type clad layer 106 the activator layer 105 and the n-type clad layer 104 are etched through dry etching to form step differences for use in an n-type electrode 110 which will be described later.

Figure 2C:
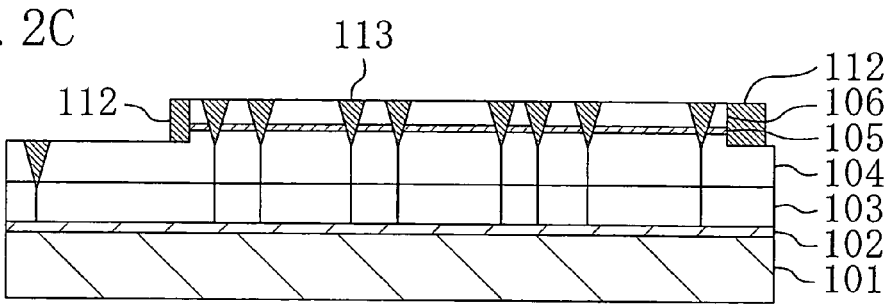

Here, as shown in FIG. 2C, by carrying out thermal processes in a water-vapor atmosphere, an oxide film 112 thickly oxidized on the side faces of the p-type clad layer 106 the activator layer 105 and the n-type clad layer 104 and oxide films 113 which have been deeply oxidized at areas having the crystal defects, are formed. During these thermal processes, oxidizing processes are selectively carried out deeply from portions at which crystal defects have reached the surfaces of the p-type clad layer 106 and the n-type clad layer 104 so that oxide films are formed. Moreover, the oxidizing process proceeds to crystal defects that are present in the activator layer 105 so that the crystal defect that forms a non-radiative center is oxidized. At areas having no crystal defects on the surfaces of the p-type clad layer 106 and the n-type clad layer 104 oxide films are thinly formed. Thus, on the p-type clad layer 106 and the n-type clad layer 104 the thick oxide films 113 are formed at areas having crystal defects, while at the areas having no crystal defects, a thin oxide films, not shown, are formed. Here, on the side faces of the step difference formed through dry etching, the oxidizing speed is fast so that a thick oxide film 112 is formed. Here, the water-vapor oxidizing processes are preferably carried out under the following conditions: for example, while water vapor of 3 mL/min (standard state) and nitrogen gas of $5 \times 10^{-3}$ mL/min (standard state) are being introduced to a quartz tube, the processing temperature is raised to 900 to 1000° C. so that it is maintained at a high temperature to allow the oxidizing process to proceed to form a thickness required for an oxide film, for example, to a thickness of 20 nm, and then the temperature is lowered. Here, the above-mentioned conditions for the water-vapor oxidizing process are applied to the following second to fourth embodiments in the same manner.

Next, by carrying out thermal processes or RIE processes in an ammonia atmosphere, the thin oxide films formed on the p-type clad layer 106 and the n-type clad layer 104 are etched and removed so that the p-type clad layer 106 and the n-type clad layer 104 are exposed. The oxide film 112 and the oxide films 113 are allowed to remain without being completely etched, because these film thicknesses of these are thick. In this case, the dry etching process is adjusted so that the thin oxide films formed on the surfaces of the p-type clad layer 106 and the n-type clad layer 104 are etched and removed, while the portion (for example, 20 nm) corresponding to such a thickness as to allow the oxide film 112 and the oxide films 113 to remain without being completely removed. Here, with respect to the etching method, the etching process is preferably carried out by using the ECR-RIE or ICP method, while a gas such as $BCl_3$ containing chlorine is used. Here, the dry-etching conditions described here are also applied to the second to fourth embodiments, which will be described later.

Figure 2D:
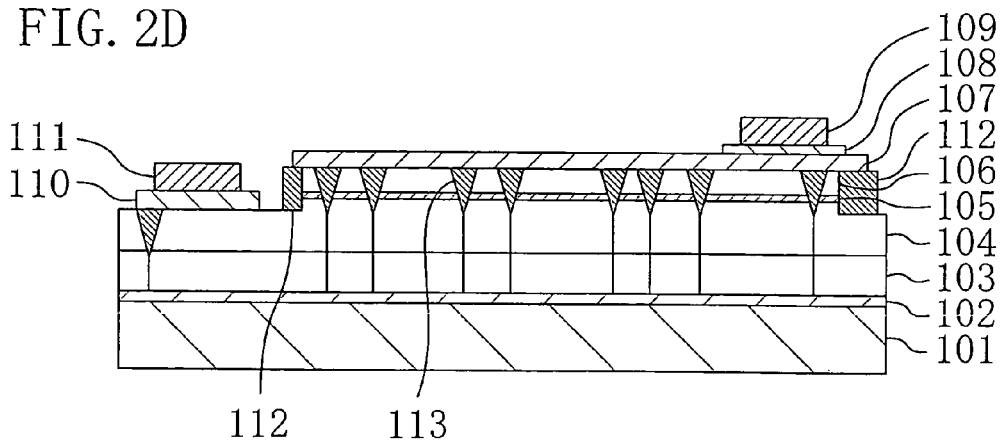

Next, as shown in FIG. 2D, an n-type electrode 110 and an electrode pad 111 are successively formed on the n-type clad layer 104 while a p-type transparent electrode 107 a p-type electrode 108 and an electrode pad 109 are successively formed on the p-type clad layer 106.

As described above, the oxide layer is selectively formed on each crystal defect that forms the non-radiative recombination center; thus, since the resulting oxide layer forms an insulating member so that it becomes possible to achieve a device structure in which a current is selectively injected to an area having no crystal defects.

Figure 3:
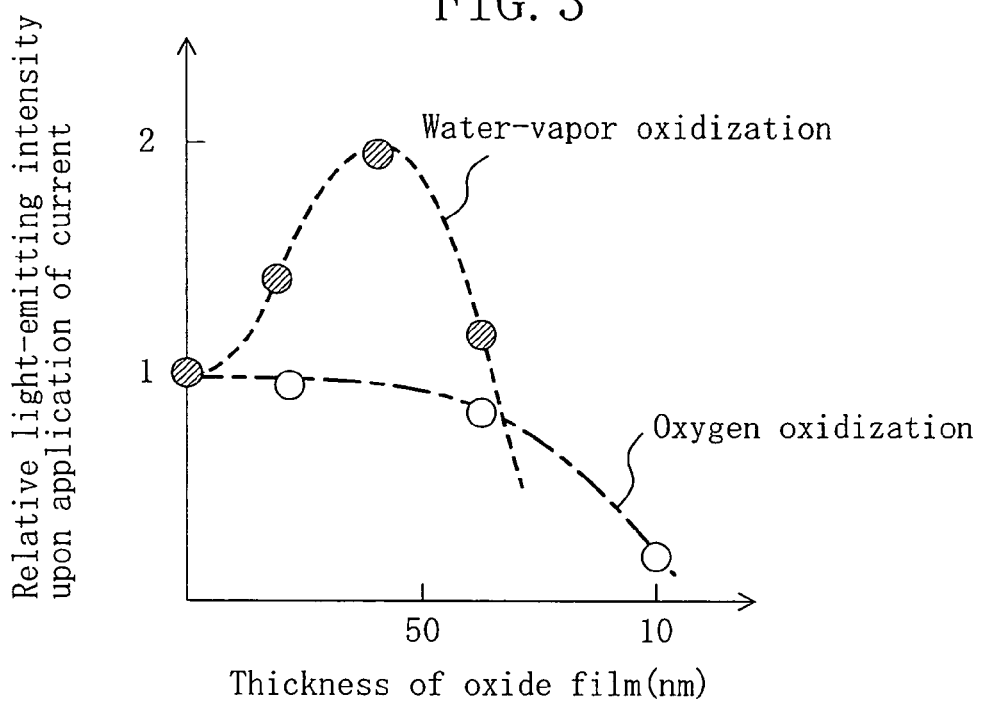
FIG. 3 is a drawing that shows relationships between the film thickness of an oxide film formed through an oxygen-oxidizing process as well as the film thickness of an oxide film formed through water-vapor-oxidizing process and the light-emitting efficiency of the light-emitting diode, in accordance with the first embodiment of the present invention.
Figure 4:
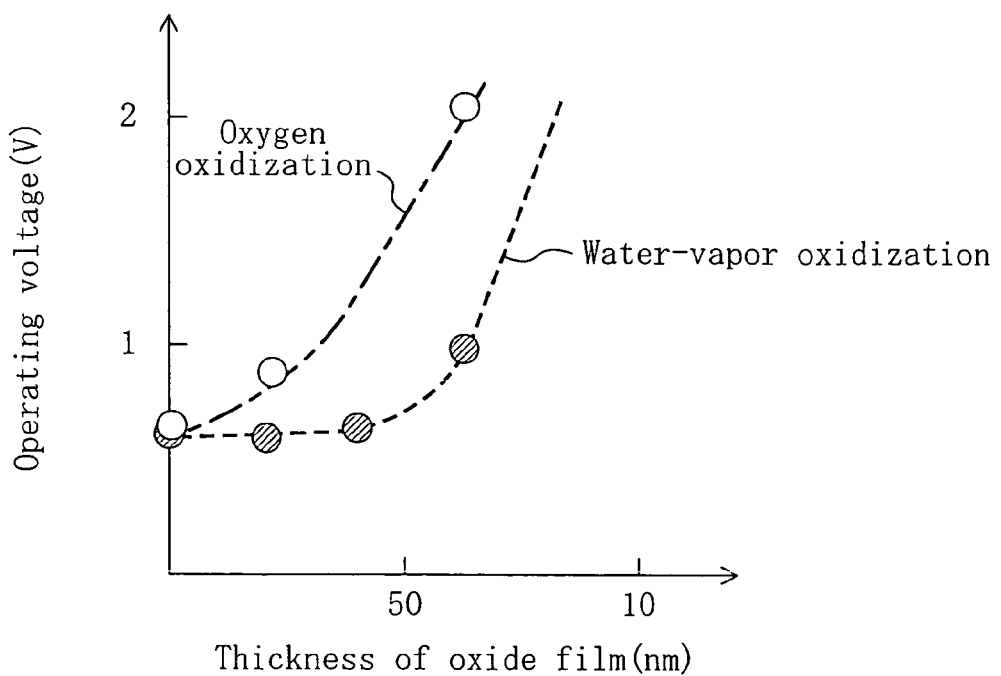
FIG. 4 is a drawing that shows relationships between the film thickness of an oxide film formed through an oxygen-oxidizing process as well as the film thickness of an oxide film formed through water-vapor-oxidizing process and the operation voltage of the light-emitting diode, in accordance with the first embodiment of the present invention.

Here, referring to FIGS. 3 and 4 the following description will discuss a mechanism by which characteristics of the light-emitting diode relating to the first embodiment of the present invention are improved.

FIG. 3 shows a relationship between the thickness of an oxide film and the light-emitting intensity.

As shown in FIG. 3, when the oxygen-oxidizing process is carried out, the oxide film is not formed deeply at an area having crystal defects as the film thickness of the oxide film increases. For this reason, since the number of the non-radiative recombination centers in the activator layer 105 is not reduced, the light-emitting intensity is not raised. Moreover, in the case when the film thickness of the oxide film is increased by further carrying out the oxidizing process, since the number of light-emitting areas in the activator layer 105 is reduced so that the light-emitting intensity is reduced.

In contrast, when the oxidizing process is carried out by using water vapor, the oxide film is formed deeply at an area having crystal defects as the film thickness of the oxide film increases. For this reason, since the crystal defects that have formed the non-radiative recombination centers in the activator layer 105 are formed into insulating members made of oxide so that a current is selectively allowed to flow into areas having no crystal defects, resulting in an increase in the light-emitting efficiency. Moreover, in the case when the film thickness of the oxide film is increased by further carrying out the oxidizing process, since the number of light-emitting areas in the activator layer 105 is reduced so that the light-emitting intensity is reduced.

FIG. 4 shows a relationship between the thickness of the oxide film and the operating voltage.

As shown in FIG. 4, when the oxygen-oxidizing process is carried out, the selectivity between the rate of oxidation that proceeds in an area having crystal defects and the rate of oxidation that proceeds on the surface of an area having no crystal defects is low, with the result that as the thickness of the oxide film increases, not only the area having the crystal defects, but also the light-emitting area is oxidized so that the operating voltage is raised. In contrast, when the oxidizing process is carried out by using water vapor, the selectivity between the rate of oxidation that proceeds in an area having crystal defects and the rate of oxidation that proceeds on the surface of an area having no crystal defects becomes greater, with the result that only the area having the crystal defects is selectively oxidized so that an operating voltage rise is small. Thus, it becomes possible to achieve an increase in the light-emitting characteristics.

Second Embodiment

The following description discusses a semiconductor device in accordance with the second embodiment of the present invention and a fabricating method for such a semiconductor device.

First, the semiconductor device of the second embodiment of the present invention is explained by exemplifying a photodetector.

Figure 5A:
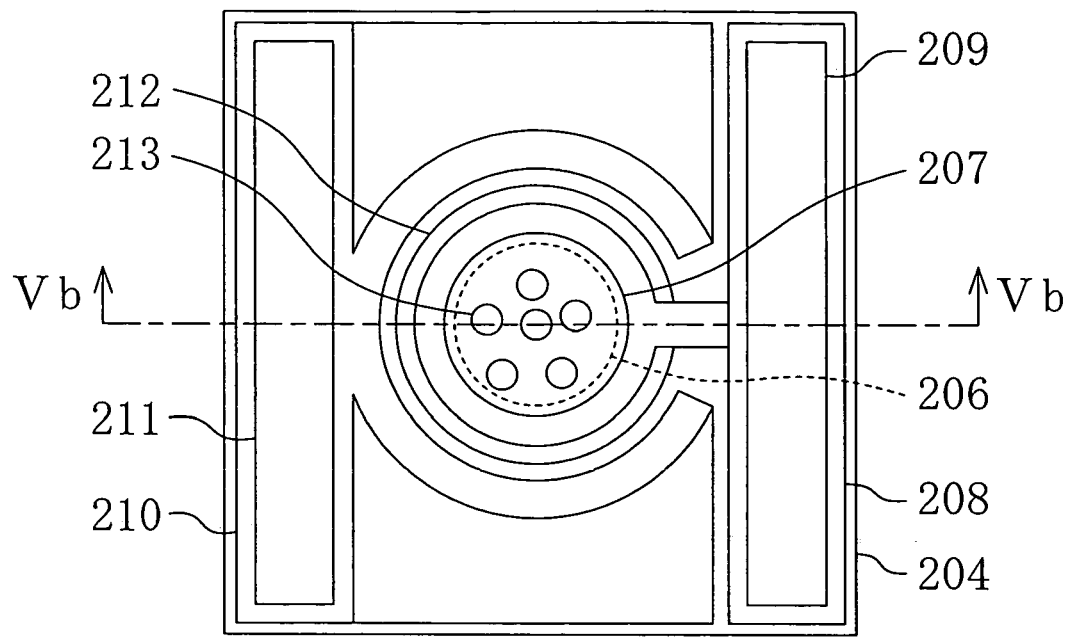
FIGS. 5A and 5B are drawings that show a light-receiving element in accordance with a second embodiment of the present invention.
Figure 5B:
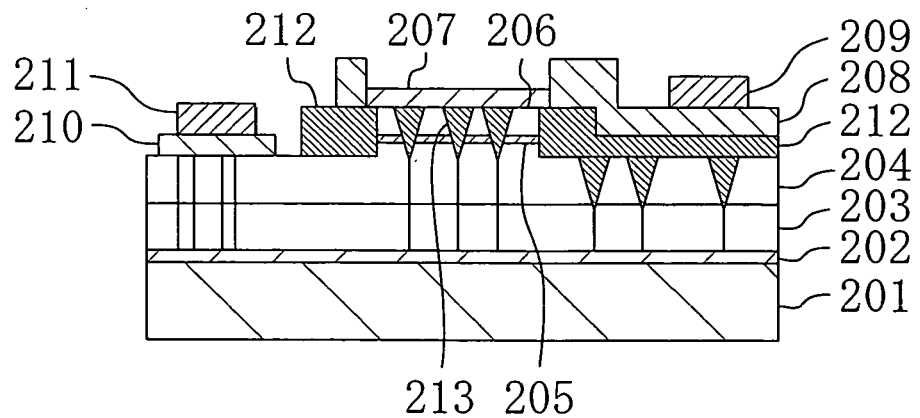

FIGS. 5A and 5B are drawings that show the light-emitting diode that serves as the semiconductor device in accordance with the first embodiment of the present invention; FIG. 5A is a plan view and FIG. 5B is a cross-sectional view taken along line Vb-Vb of FIG. 5A.

As shown in FIGS. 5A and 5B, on a sapphire substrate 201, a buffer layer 202 made from AlN or GaN, an undoped layer 203 made from a mixed crystal of AlGaN, an n-type clad layer 204 made from a mixed crystal of AlGaN, a light-receiving active layer 205 made from AlGaN and a p-type clad layer 206 made from AlGaN are stacked in succession from the bottom. A transparent electrode 207 is formed on the entire surface of the p-type clad layer 206. Moreover, the p-type clad layer 206 the light-receiving active layer 205 and the n-type clad layer 204 are etched through dry etching to form step differences; thus, on these step differences, a ring-shaped p-type electrode 208 and an electrode pad 209 are formed through an oxide film 212 which will be described later, are successively formed from the bottom, and an n-type electrode 210 and an electrode pad 211 are further formed thereon successively from the bottom.

Here, with respect to the n-type clad layer 204 and the p-type clad layer 206, Si and Mg are respectively used as dopants, and the respective carrier densities of the n-type clad layer 204 and the p-type clad layer 206 are set to $5 \times 10^{17}$ cm$^{-3}$.

Moreover, the following {Table 2} shows one example of compositions and layer thicknesses of the respective layers constituting the photodetector in accordance with the second embodiment.

TABLE 2

| Layer Name | Composition | Layer thickness |
|---|---|---|
| Electrode pad 211 | Au | 4 μm |
| n-type electrode 210 | Ti/ | 5 nm/ |
|  | Al/ | 100 nm/ |
|  | Pt/ | 10 nm/ |
|  | Au | 200 nm |

TABLE 2-continued

| Layer Name | Composition | Layer thickness |
|---|---|---|
| Electrode pad 209 | Au | 4 μm |
| p-type electrode 208 | Ni/ | 5 nm/ |
|  | Au | 200 nm |
| p-type transparent electrode 207 | ITO (Indium Tin Oxide) | 30 nm |
| p-type clad layer 206 | p-type $Al_{0.25}Ga_{0.75}N$ | 10 nm |
| Light-receiving active layer 205 | $Al_{0.15}Ga_{0.85}N$ (Well layer) | 30 nm |
| n-type clad layer 204 | n-type $Al_{0.25}Ga_{0.75}N$ clad layer | 500 nm |
| Undoped layer 203 | Undoped $Al_{0.25}Ga_{0.75}N$ layer | 1 μm |
| Buffer layer 202 | AlN.GaN buffer layer | 40 nm |

Here, as shown in FIGS. 5A and 5B, crystal defects penetrate the undoped layer 203 the n-type clad layer 204 the light-receiving active layer 205 and the p-type clad layer 206 with a crystal-defect density being set to about $5 \times 10^9$ cm$^{-2}$. At portions in which the crystal defects reach the upper surface of the p-type clad layer 206 oxide films 213 which have been oxidized deeply at areas having the crystal defects, are formed. The depth of each of oxide films 213 that have been oxidized deeply at the areas having crystal defects is, for example, 50 nm so that the crystal defect is oxidized in such a depth as to penetrate the light-receiving active layer 205.

Moreover, each of oxide films 213 that have been oxidized deeply at the area having crystal defects is formed by processes in which, after oxidizing the p-type clad layer 206 by using a gas containing water vapor, the resulting thin oxide film formed on the surface thereof is removed. Step differences are formed by etching the n-type clad layer 204 the light-receiving active layer 205 and the p-type clad layer 206 through dry etching, and an oxide film 212 thickly oxidized is formed on the side faces of the n-type clad layer 204 the light-receiving active layer 205 and the p-type clad layer 206 that constitute the step differences. With this structure, current leak is prevented on the side faces of the n-type clad layer 204 the light-receiving active layer 205 and the p-type clad layer 206.

The oxide film 212 that is formed on the side faces of the n-type clad layer 204 the light-receiving active layer 205 and the p-type clad layer 206 and the oxide film 213 that has been oxidized deeply at the area having a crystal defect are insulating members so that it is possible to prevent leak current flowing through the side faces of the n-type clad layer 204 the light-receiving active layer 205 and the p-type clad layer 206 and a non-radiative current that flows through the crystal defect; therefore, an electric current is selectively injected to a light-emitting area having no crystal defects. Moreover, since this structure prevents the generation of carriers to cause noise upon application of a bias voltage, light-receiving areas having no crystal defects are allowed to selectively function so that it becomes possible to realize a photodetector that achieves a noise reduction with high efficiency.

Third Embodiment

The following description discusses a semiconductor device in accordance with the third embodiment of the present invention and a fabricating method for such a semiconductor device.

First, the semiconductor device of the third embodiment of the present invention is explained by exemplifying a semiconductor laser element.

Figure 6A:
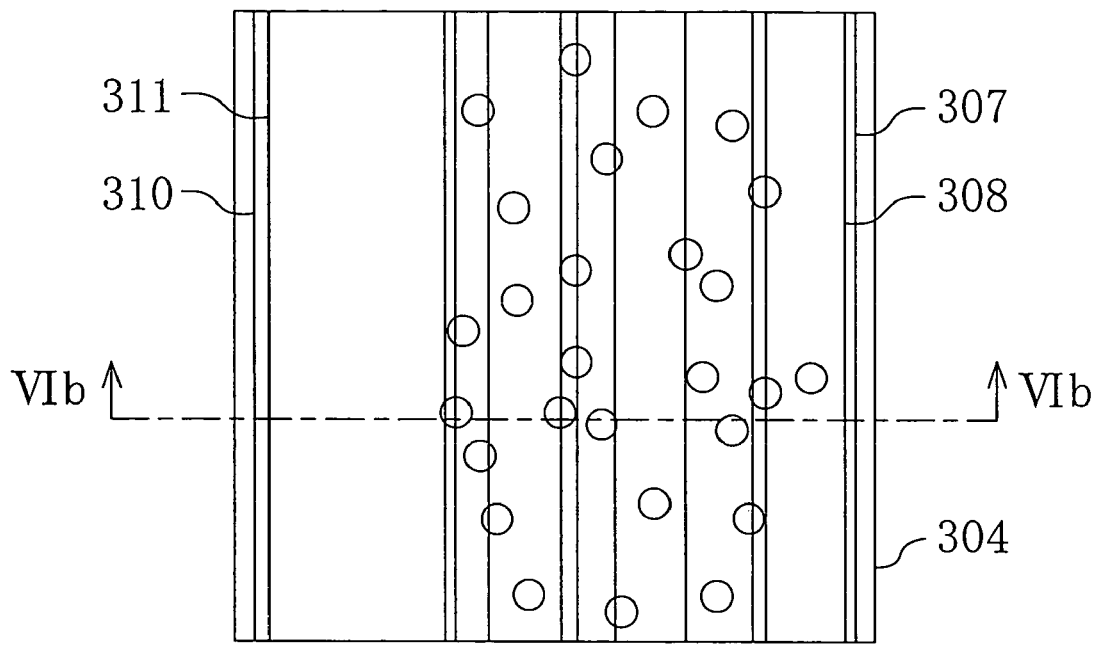
FIGS. 6A and 6B are drawings that show a semiconductor laser device in accordance with a third embodiment of the present invention.
Figure 6B:
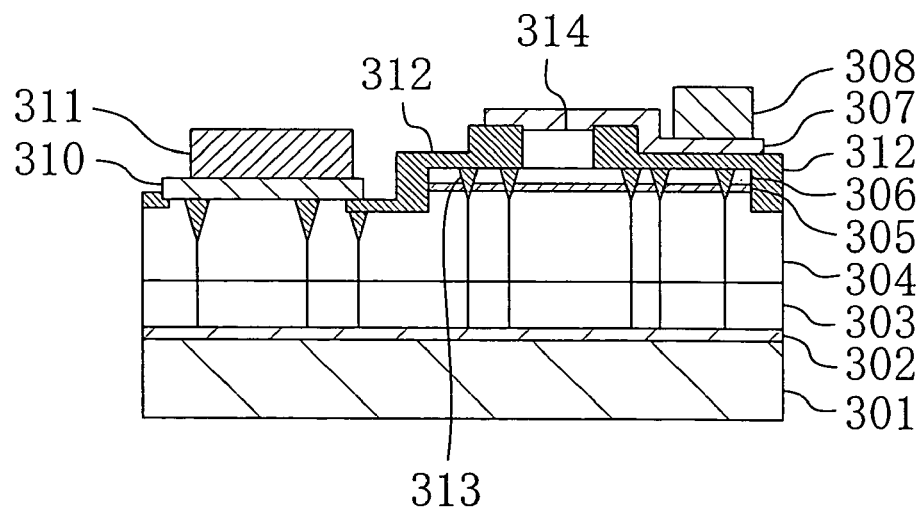

FIGS. 6A and 6B are drawings that show the light-emitting diode in accordance with the third embodiment of the present invention; FIG. 6A is a plan view and FIG. 6B is a cross-sectional view taken along line VIb-VIb of FIG. 6A.

As shown in FIGS. 6A and 6B, on a sapphire substrate 301, a buffer layer 302 made from AlN or GaN, an undoped layer 303 made from a mixed crystal of AlGaN, an n-type clad layer 304 made from a mixed crystal of AlGaN, an activator layer 305 made of a GaN/AlGaN laminated film and a p-type clad layer 306 made from AlGaN are stacked in succession from the bottom. A ridge waveguide path 314 having a stripe shape with a width of 1.5 μm is formed on the p-type clad layer 306 through dry etching, and a p-type electrode 307 and an electrode pad 308 are successively formed on the ridge waveguide path 314 from the bottom. Here, the p-type clad layer 306 is etched to a thickness of 150 nm by dry etching.

Moreover, step differences are formed by etching the p-type clad layer 306 the activator layer 305 and the n-type clad layer 304 through dry etching, and an n-type electrode 310 and an electrode pad 311 are formed on the n-type clad layer 304 that constitutes this step difference.

Here, with respect to the n-type clad layer 304 and the p-type clad layer 306, Si and Mg are respectively used as dopants, and the respective carrier densities of the n-type clad layer 304 and the p-type clad layer 306 are respectively set to $2 \times 10^{18}$ cm$^{-3}$ and $5 \times 10^{17}$ cm$^{-3}$.

Moreover, the following {Table 3} shows one example of compositions and layer thicknesses of the respective layers constituting the semiconductor laser element in accordance with the third embodiment.

TABLE 3

| Layer Name | Composition | Layer thickness |
| --- | --- | --- |
| Electrode pad 312 | Au | 4 μm |
| n-type electrode 311 | Ti/ | 5 nm/ |
|  | Al/ | 100 nm/ |
|  | Pt/ | 10 nm/ |
|  | Au | 200 nm |
| Electrode pad 308 | Au | 4 μm |
| p-type electrode 307 | Ni/ | 5 nm/ |
|  | Au | 200 nm |
| p-type clad layer 306 | p-type Al$_{0.25}$Ga$_{0.75}$N | 800 nm |
| Activator layer 305 | Al$_{0.25}$Ga$_{0.75}$N (Barrier layer) / | 5 nm |
|  | Al$_{0.15}$Ga$_{0.85}$N (Well layer) / | 2 nm |
|  | (× 3 cycle) | 6 nm |
|  | ⋮ |  |
|  | Al$_{0.25}$Ga$_{0.75}$N (Barrier layer) |  |
| n-type clad layer 304 | n-type Al$_{0.25}$Ga$_{0.75}$N clad layer | 500 nm |
| Undoped layer 303 | Undoped Al$_{0.25}$Ga$_{0.75}$N layer | 1 μm |
| Buffer layer 302 | AlN.GaN buffer layer | 40 nm |

Here, as shown in FIGS. 6A and 6B, crystal defects penetrate the undoped layer 303 the n-type clad layer 304 the activator layer 305 and the p-type clad layer 306 with a crystal-defect density being set to about $5 \times 10^9$ cm$^{-2}$. At portions in which the crystal defects reach the upper surface of the p-type clad layer 306 oxide films 313 which have been oxidized deeply at areas having the crystal defects, are formed. The depth of each of oxide films 313 that have been oxidized deeply at the areas having crystal defects is, for example, 50 nm so that the crystal defect is oxidized in such a depth as to penetrate the activator layer 305.

Moreover, each oxide film 313 that has been oxidized deeply at the area having a crystal defect is formed by oxidizing crystal defects in the p-type clad layer 306 and the ridge waveguide path 314 using a gas containing water vapor.

At step differences formed by dry etching so as to reach the n-type clad layer 304 an oxide film 312 thickly oxidized, is formed on the side face of the ridge waveguide path 314 constituting the step differences and the side faces of the p-type clad layer 306 the activator layer 305 and the n-type clad layer 304. With this structure, current leak is prevented on the side face of the ridge waveguide path 314 and the side faces of the p-type clad layer 306 the n-type clad layer 304 and the activator layer 305.

The oxide film 312 which is formed on the side face of the ridge waveguide path 314 and the side faces of the p-type clad layer 306 the n-type clad layer 304 and the activator layer 305 and the oxide film 313 which has been oxidized deeply at the area having a crystal defect, are insulating members so that it is possible to prevent leak current flowing through the side faces of the ridge waveguide path 314 and the side faces of the p-type clad layer 306 the n-type clad layer 304 and the activator layer 305 and a non-radiative current that flows through the crystal defect; therefore, an electric current is selectively injected to a light-emitting area having no crystal defects. Thus, it is possible to realize a semiconductor laser having a low threshold value, with high efficiency.

Fourth Embodiment

The following description discusses a semiconductor device in accordance with the fourth embodiment of the present invention and a fabricating method for such a semiconductor device.

First, the semiconductor device of the fourth embodiment of the present invention is explained by exemplifying a semiconductor laser element.

Figure 7A:
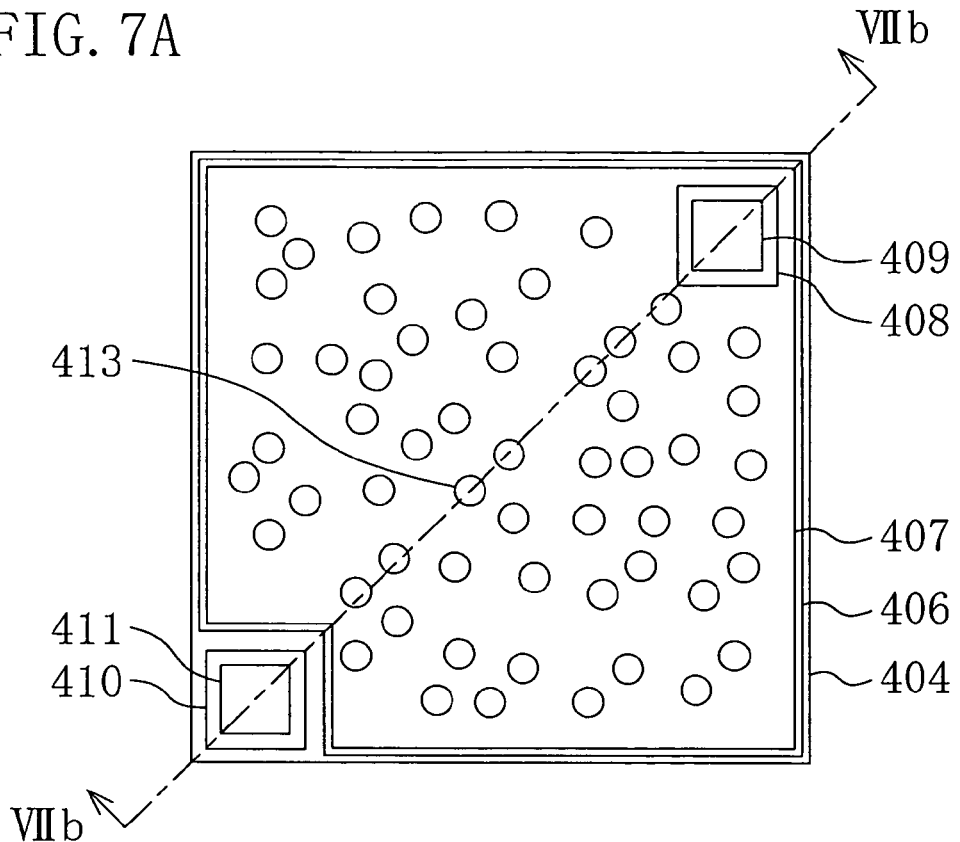
FIGS. 7A and 7B are drawings that show a semiconductor laser device in accordance with a fourth embodiment of the present invention.
Figure 7B:
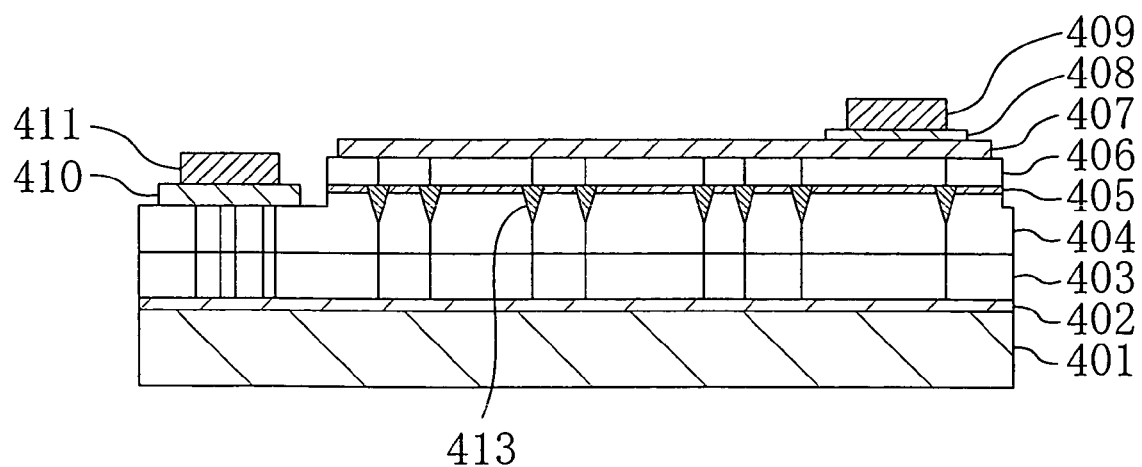

FIGS. 7A and 7B are drawings that show the light-emitting diode as an semiconductor device in accordance with the fourth embodiment of the present invention; FIG. 7A is a plan view and FIG. 7B is a cross-sectional view taken along line VIIb-VIIb of FIG. 7A.

As shown in FIGS. 7A and 7B, on a sapphire substrate 401, a buffer layer 402 made from AlN or GaN, an undoped layer 403 made from a mixed crystal of AlGaN, an n-type clad layer 404 made from a mixed crystal of AlGaN, an activator layer 405 made of an AlGaN/AlGaN laminated film and a p-type clad layer 406 made from AlGaN are stacked in succession from the bottom. A p-type transparent electrode 407 is formed on the entire surface of the p-type clad layer 406 and an electrode pad 409 is formed on one corner of the p-type transparent electrode 407 through a p-type electrode 408. Moreover, the p-type clad layer 406 the activator layer 405 and the n-type clad layer 404 are etched through dry etching to form step differences; thus, on the n-type clad layer 404 that is located diagonally to the electrode pad 409 to form a step difference, an n-type electrode 410 and an electrode pad 411 are formed in succession from the bottom.

Here, with respect to the n-type clad layer 404 and the p-type clad layer 406, Si and Mg are respectively used as dopants, and the respective carrier densities of the n-type clad layer 404 and the p-type clad layer 406 are $2 \times 10^{18}$ cm$^{-3}$ and $5 \times 10^{17}$ cm$^{-3}$.

Moreover, the following {Table 4} shows compositions and layer thicknesses of the respective layers constituting the light-emitting diode in accordance with the fourth embodiment.

TABLE 4

| Layer Name | Composition | Layer thickness |
|---|---|---|
| Electrode pad 411 | Au | 4 μm |
| n-type electrode 410 | Ti/ | 5 nm/ |
| | Al/ | 100 nm/ |
| | Pt/ | 10 nm/ |
| | Au | 200 nm |
| Electrode pad 409 | Au | 4 μm |
| p-type electrode 408 | Ni/ | 5 nm/ |
| | Au | 200 nm |
| p-type transparent electrode 407 | ITO (Indium Tin Oxide) | 30 nm |
| p-type clad layer 406 | p-type $Al_{0.25}Ga_{0.75}N$ | 30 nm |
| Activator layer 405 | $Al_{0.25}Ga_{0.75}N$ (Barrier layer) / $Al_{0.15}Ga_{0.85}N$ (Well layer) / (× 3 cycle) ⋮ $Al_{0.25}Ga_{0.75}N$ (Barrier layer) | 5 nm 2 nm 6 nm |
| n-type clad layer 404 | n-type $Al_{0.25}Ga_{0.75}N$ clad layer | 500 nm |
| Undoped layer 403 | Undoped $Al_{0.25}Ga_{0.75}N$ layer | 1 μm |
| Buffer layer 402 | AlN.GaN buffer layer | 40 nm |

Here, as shown in FIGS. 7A and 7B, crystal defects penetrate the undoped layer 403 the n-type clad layer 404 the activator layer 405 and the p-type clad layer 406 with a crystal-defect density being set to about $5 \times 10^9$ cm$^{-2}$. Here, inside the activator layer 405, oxide films 413 which have been deeply oxidized selectively at areas having the crystal defects in the activator layer 405 are formed. The depth of each of oxide films 413 that have been oxidized deeply at the areas having crystal defects is, for example, 10 nm so that the crystal defect is oxidized in such a depth as to penetrate only the activator layer 405.

Here, each oxide film 413 that has been oxidized deeply at the area having a crystal defect is formed by processes in which, after allowing the activator layer 405 to grow, the crystal defect is oxidized by using a gas containing water vapor. In this manner, simultaneously as the crystal defect is oxidized, a thin oxide film having a thickness of, for example, 2 nm, is formed on the surface of the activator layer 405. Therefore, the thin oxide film formed on the surface is removed by carrying out a thermal treatment by using ammonia gas. In this thermal treatment, each oxide film 413 that has been oxidized deeply at the area having a crystal defect is left without being removed. Thereafter, the p-type clad layer 406 is allowed to grow so that each oxide film 413 that has been oxidized deeply at the area having a crystal defect is embedded.

Since each oxide film 413 that has been oxidized deeply in the crystal defect that is present in the activator layer 405 is an insulating member, it is possible to prevent a non-radiative current that flows through the crystal defect. Moreover, the oxide film is not formed on the crystal defect that penetrates the p-type clad layer 406 with only the area having the crystal defect in the activator layer 405 being oxidized; therefore, it is possible to selectively form a fine insulating film in the area having crystal defects in the activator layer 405. With this structure, the current is selectively injected to the light-emitting area without crystal defects in the activator layer 405 so that it becomes possible to achieve a light-emitting diode having high efficiency.

Fifth Embodiment

Figure 8:
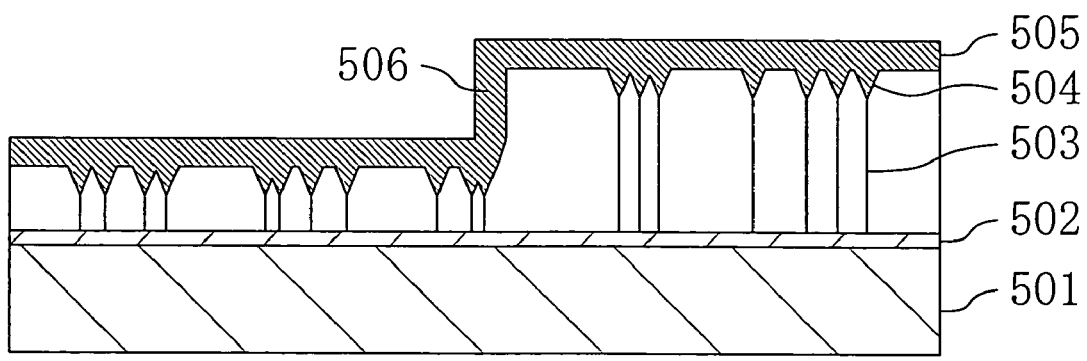
FIG. 8 is a cross-sectional view that shows a shape of an oxide film that is formed on a GaN layer when the oxygen-oxidizing process is carried out in accordance with the fifth embodiment of the present invention.
Figure 9:
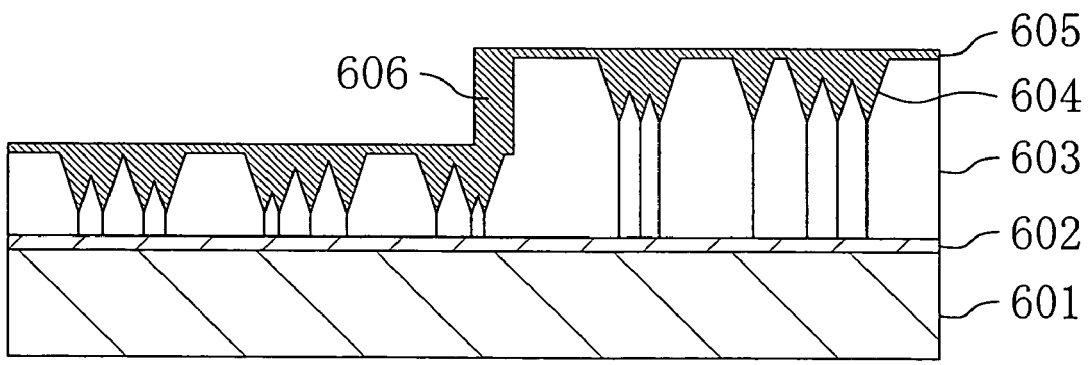
FIG. 9 is a cross-sectional view that shows a shape of an oxide film that is formed on a GaN layer when the water-vapor-oxidizing process is carried out in accordance with the fifth embodiment of the present invention.

Referring to FIGS. 8 and 9 the following description discusses a fifth embodiment of the present invention.

FIG. 8 is a cross-sectional view that shows a sample containing an oxide film that has been formed when a GaN layer having crystal defects is oxidized in an oxygen atmosphere, and FIG. 9 is a cross-sectional view that shows a sample containing an oxide layer that has been formed when a GaN layer having crystal defects is oxidized in a water vapor atmosphere.

First, as shown in FIG. 8, after a buffer layer 502 made from GaN has been grown on the sapphire substrate 501 by the MOCVD method under a condition in which the growing temperature is set to, for example, 500° C., each GaN layer 503 is allowed to grow through the buffer layer 502. Thereafter, dry etching processes are carried out so as to form a step difference on each of the GaN layers 503. Here, the crystal defect density of the GaN layer 503 is set to, for example, $2 \times 10^9$ cm$^{-2}$.

Here, as shown in FIG. 8, when the GaN layer 503 is oxidized in an oxygen atmosphere, oxide layers 504, 505 and 506 made from $Ga_2O_3$, are formed on the surface of the GaN layer 503. The oxide layer 505 which is an oxide film formed on an area having no crystal defects in the GaN layers 503 is an oxide film having an even layer thickness, and the thickness of the oxide layer 505 is set to, for example, 75 nm. Moreover, the oxide layer 504 which is an oxide film formed on an area having crystal defects in the GaN layers 503 is deeply formed in each of the crystal defects. The thickness of the oxide layer 504 is set to, for example, 150 nm. Moreover, the oxide layer 506 which is an oxide film formed on the side face of the step difference formed by the dry etching, is allowed to have virtually the same thickness as that of the oxide layer 505 having an even layer thickness.

The above-mentioned oxygen-oxidizing processes are preferably carried out under the following conditions: for example, while an oxygen gas of 3 mL/min (standard state) is being introduced to a quartz tube, the processing temperature is raised to 1000° C. so that it is maintained at a high temperature for 6 minutes to allow the oxidizing process to form a thickness required for an oxide film, for example, to a thickness of 30 nm, and then the temperature is lowered.

Here, as shown in FIG. 9, after a buffer layer 602 made from GaN has been grown on the sapphire substrate 601 by the MOCVD method, a GaN layer 603 is further grown thereon through the buffer layer 602. Thereafter, dry etching processes are carried out so as to form a step difference on each of the GaN layers 603.

Here, when the GaN layer 603 is oxidized in a water vapor atmosphere, oxide layers 604, 605 and 606 made from $Ga_2O_3$, are formed on the surface of the GaN layer 603. The oxide layer 605 which is an oxide film formed on an area having no crystal defects in the GaN layers 603 is an oxide film having an even layer thickness, and the thickness of the oxide layer 605 is set to, for example, 30 nm. Moreover, the oxide layer 604 which is an oxide film formed on an area having crystal defects in the GaN layers 603 is deeply formed in each of the crystal defects. The thickness of the oxide layer 604 is set to, for example, 150 nm, which is much deeper than the layer thickness of the above-mentioned oxide layer 504 that has been subjected to the oxygen oxidation. Moreover, the oxide layer 606 which is an oxide film formed on the side face of the step difference formed by the dry etching, is subjected to a quicker oxidizing process in comparison with the oxide layer 605 having an even layer thickness so that the thickness of the oxide layer 606 is set to, for example, 150 nm.

The above-mentioned water-vapor-oxidizing process is preferably carried out under the following conditions: for example, while water vapor of 3 mL/min (standard state) and nitrogen gas of $5\times10^{-3}$ mL/min (standard state) are being introduced to a quartz tube, the processing temperature is raised to 1000° C. so that it is maintained at a high temperature for 90 minutes to allow the oxidizing process to proceed to form a thickness required for an oxide film, for example, to a thickness of 30 nm, and then the temperature is lowered.

As described above, depending on whether the atmosphere to be used for the oxidizing process is oxygen or water vapor, the oxidizing rate differs greatly between the area having crystal defects and the side face of the step difference formed through the dry etching.

The following description will discuss the relationship between the thickness of an oxide layer and the oxidation depth of the oxide layer formed on an area having crystal defects, in the respective cases of the water-vapor-oxidizing process and the oxygen-oxidizing process.

Figure 10A:
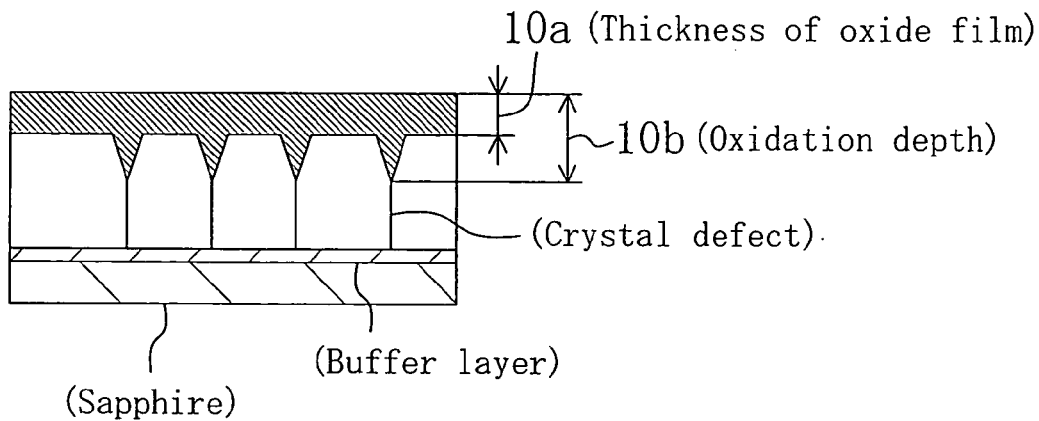
FIG. 10A is a cross-sectional view that is used upon defining the thickness of an oxide film and the oxidation depth in accordance with a fifth embodiment of the present invention.
Figure 10B:
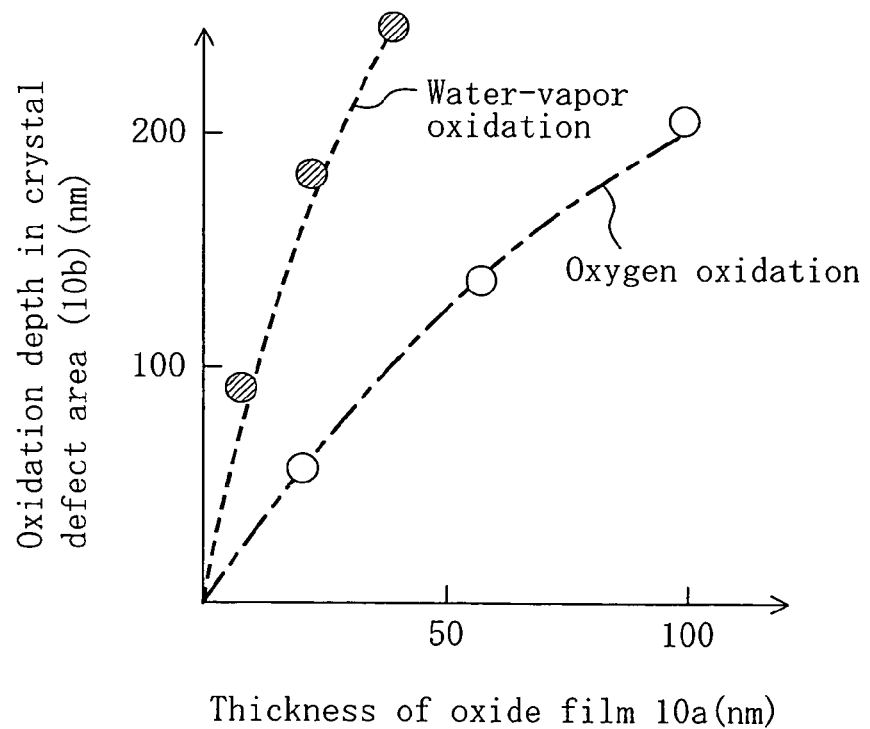
FIG. 10B is a drawing that shows a relationship between the film thickness of an oxide film formed through the oxygen-oxidizing process as well as the film thickness of an oxide film formed through the water-vapor-oxidizing process and the oxidation depth in a crystal defect area.

FIG. 10A is a cross-sectional view that is used upon defining the thickness of an oxide layer and the oxidation depth of the oxide layer that is formed on an area having crystal defects, and FIG. 10B is a drawing that shows a relationship between the film thickness of an oxide layer that is formed on an area having no crystal defects and the film thickness of an oxide layer (oxidation depth) that is deeply oxidized in an area having a crystal defect that reaches the GaN surface.

First, as shown in FIG. 10A, the thickness of the oxide layer formed on an area having no crystal defects is defined as a thickness 10a of the oxide layer, and the thickness of the oxide layer deeply oxidized in a crystal defect that reaches the GaN surface is defined as an oxidation depth 10b.

Under the above-mentioned definitions, as shown in FIG. 10B, in the case of the oxygen-oxidizing process, the ratio between the thickness 10a of the oxide layer and the oxidation depth 10b is about 1:2; in contrast, in the case of the water-vapor-oxidizing process, the ratio between the thickness 10a of the oxide layer and the oxidation depth 10b is about 1:5. Consequently, the results shown in FIG. 10B indicate that in the case of the water-vapor-oxidizing process, the areas having crystal defects are deeply oxidized selectively in comparison with the case in which the oxygen-oxidizing process is carried out.

Sixth Embodiment

The following description discusses a semiconductor device in accordance with the sixth embodiment of the present invention and a fabricating method for such a semiconductor device.

First, the semiconductor device of the sixth embodiment of the present invention is explained by exemplifying a field-effect transistor.

Figure 11A:
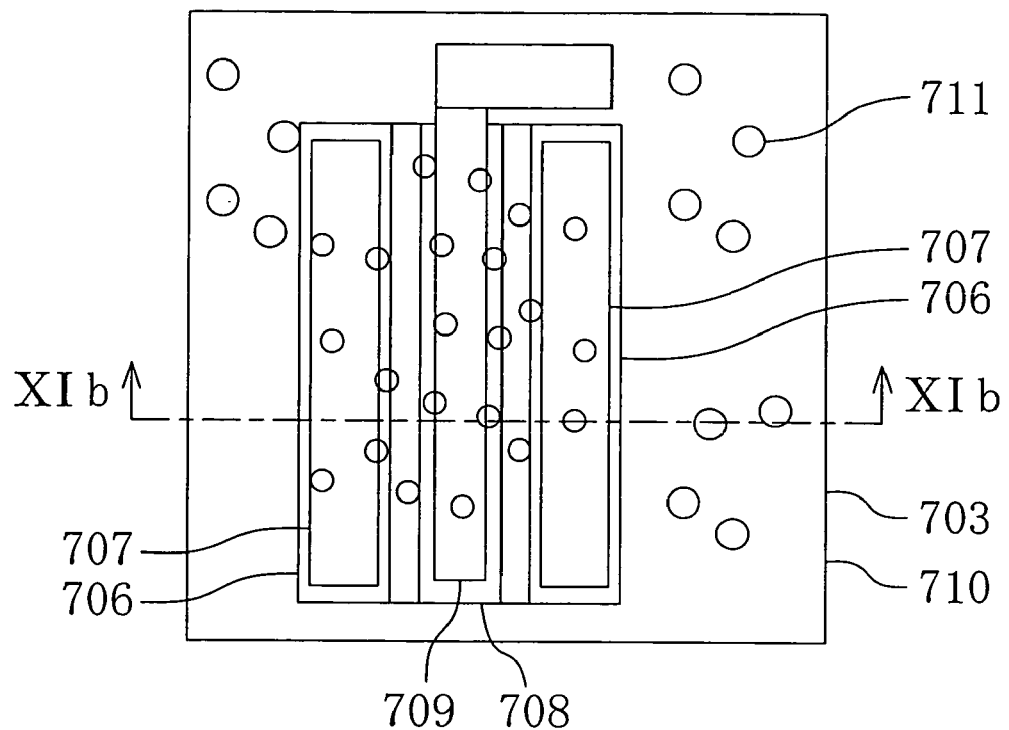
FIGS. 11A and 11B show a field-effect transistor in accordance with a sixth embodiment of the present invention.
Figure 11B:
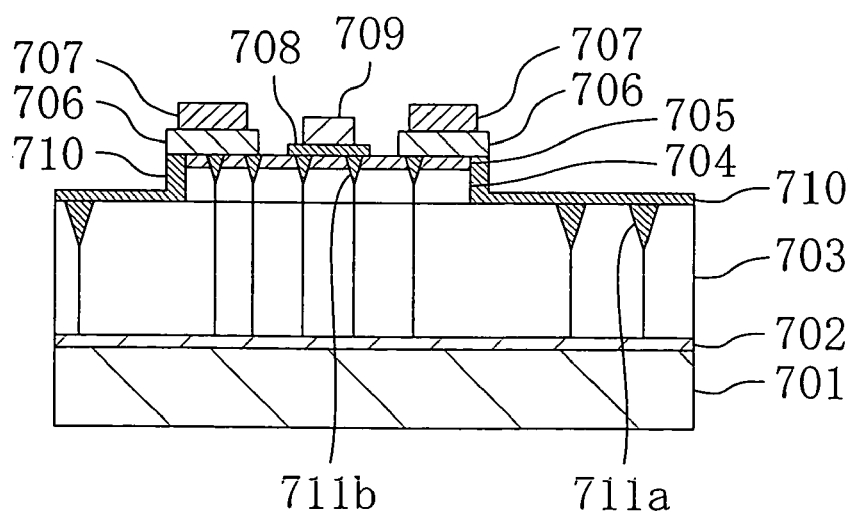

FIGS. 11A and 11B are drawings that show the field-effect transistor serving as the semiconductor device in accordance with the sixth embodiment of the present invention; FIG. 11A is a plan view and FIG. 11B is a cross-sectional view taken along line XIb-XIb of FIG. 11A.

As shown in FIGS. 11A and 11B, on a sapphire substrate 701, a buffer layer 702 made from AlN or GaN, an undoped layers 703 and 704 made from GaN, and a channel layer 705 made from a mixed crystal of AlGaN are stacked in succession from the bottom. Here, each of element-separation oxide films 711a is formed in the undoped layer 703. Moreover, on the channel layer 705 an n-type electrode 706 and an electrode pad 707 are successively formed from the bottom, while a gate oxide film 708 and a gate electrode 709 are successively formed from the bottom.

Moreover, the following {Table 5} shows compositions and layer thicknesses of the respective layers constituting the field-effect transistor in accordance with the sixth embodiment.

TABLE 5

| Layer Name | Composition | Layer thickness |
|---|---|---|
| Electrode pad 709 | Ti/ | 5 nm/ |
|  | Au | 200 nm |
| Gate oxide film 708 | (Al)GaOx | 10 nm |
| Element separation oxide film 711a | (Al)GaOx | 100 nm |
| Electrode pad 707 | Au | 4 μm |
| n-type electrode 706 | Ti/ | 5 nm/ |
|  | Al/ | 100 nm/ |
|  | Pt/ | 10 nm/ |
|  | Au | 200 nm |
| Channel layer 705 | Undoped $Al_{0.15}Ga_{0.85}N$ layer | 25 nm |
| Undoped layer 703 | Undoped GaN layer | 2 μm |
| Buffer layer 702 | AlN.GaN buffer layer | 40 nm |

As shown in FIGS. 11A and 11B, crystal defects penetrate the undoped layers 703, 704 and the channel layer 705 with a crystal-defect density being set to about $5\times10^9$ cm$^{-2}$. Here, at portions in which the crystal defects reach the surface of the channel layer 705 oxide films 711b, which have been oxidized deeply at areas having the crystal defects, are formed. The depth of each of oxide films 711b that have been oxidized deeply at the areas having crystal defects is, for example, 30 nm so that the crystal defect is oxidized in such a depth as to penetrate the undoped layer 704.

Here, each oxide film 711b that has been oxidized deeply at the area having a crystal defect is formed by oxidizing the crystal defect using a gas containing water vapor in the channel layer 705. In this manner, simultaneously as the crystal defect is oxidized, a thin oxide film is formed on the surface of the channel layer 705. Here, the thin oxide film formed on the surface can be removed by carrying out a thermal treatment using, for example, ammonia gas. In this thermal treatment, each oxide film 711b that has been oxidized deeply in the crystal defect is left without being removed. Moreover, on the step difference that has been formed by dry etching so as to reach the undoped layer 703 an oxide film 710 thickly oxidized on the side faces of the undoped layer 703 the undoped layer 704 and the channel layer 705 that constitute the step difference, is formed. With this structure, it becomes possible to prevent current leak on the side faces of the undoped layer 703 the undoped layer 704 and the channel layer 705.

Since each oxide film 711b that has been oxidized deeply in the area having a crystal defect and the oxide film 710 formed on the side faces of the undoped layer 703 the undoped layer 704 and the channel layer 705 are insulating members, it is possible to prevent a non-radiative current that flows through the crystal defect and a leak current that flows through the side faces of the undoped layer 703 the undoped layer 704 and the channel layer 705. For this reason, channel areas having no crystal defects are allowed to selectively function so that it becomes possible to achieve a field-effect transistor having high efficiency.

Seventh Embodiment

Figure 12:
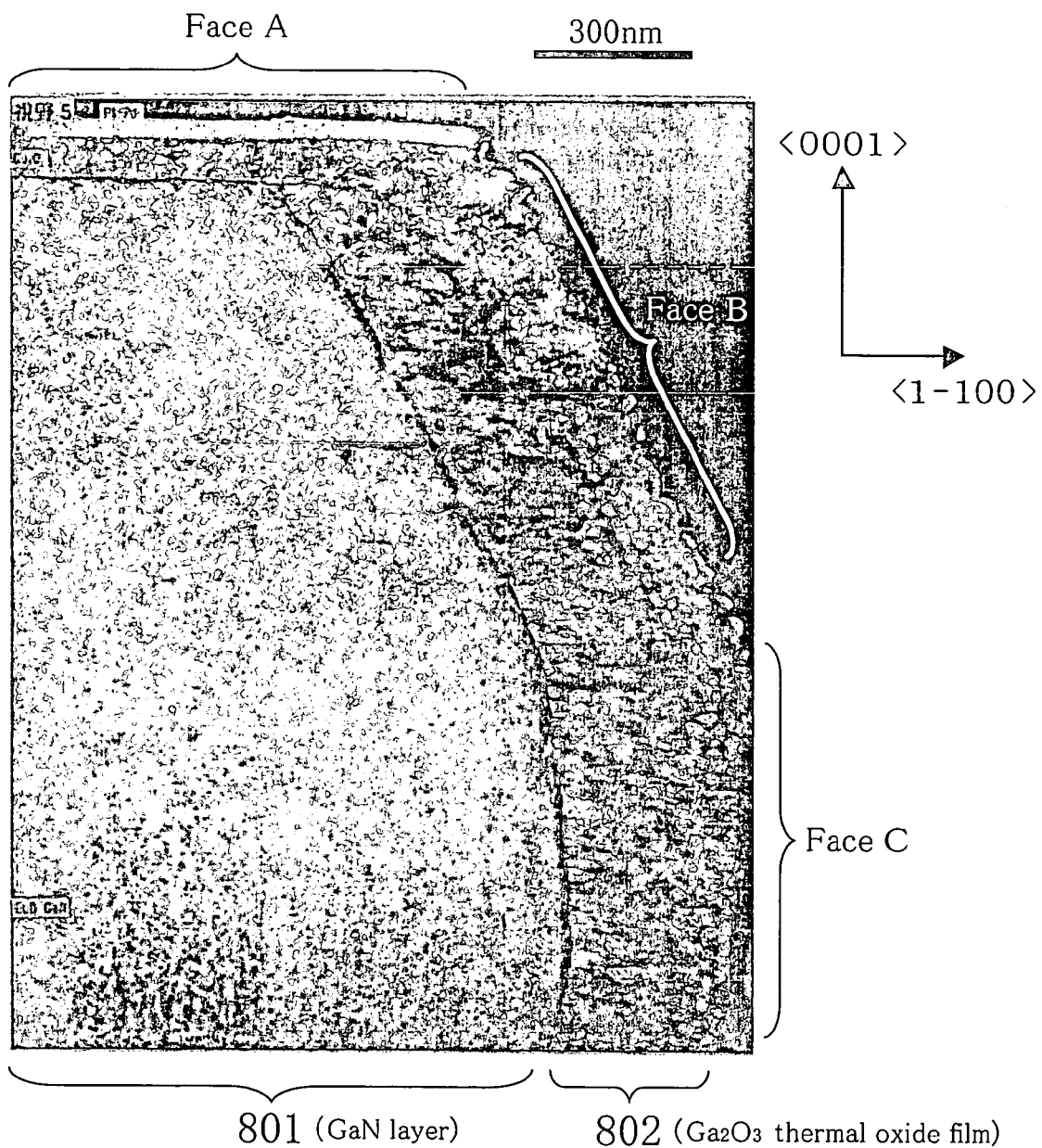
FIG. 12 is a TEM cross-sectional view that shows oxide films formed on different faces on a nitride semiconductor layer in accordance with a seventh embodiment of the present invention.

Referring to FIG. 12, the following description will discuss a fabricating method for a semiconductor device in accordance with the seventh embodiment of the present invention.

The above-mentioned first to sixth embodiments have discussed the difference in thicknesses of oxide layers formed on the surface and the side face, when a semiconductor layer or an active layer made of a semiconductor layer is oxidized; and the seventh embodiment explains this point more specifically.

FIG. 12, which relates to a case in which, for example, a GaN layer is oxidized, shows a cross-sectional TEM image of the GaN layer that explains layer thicknesses of an oxide layer to be formed on faces having respectively different face orientations in the GaN layer.

As shown in FIG. 12, after a GaN layer 801 has been grown with different face orientations, for example, shown by faces A to C, through a selective growing technique using the MOCVD method, this layer is subjected to a thermal treatment at a temperature of 1000° C. for 90 minutes in a water-vapor atmosphere so that a thermal oxide film 802 made from $Ga_2O_3$ is formed.

As clearly shown in FIG. 12, the thickness of the thermal oxide film 802 on face A (main face) forming a (0001) face is about 60 nm, which is thin, while the thicknesses of the oxide film on (face B) and (face C) that are different from the (0001) face are not less than 200 nm, which is thick.

By carrying out the water-vapor oxidizing process as described above, it is possible to selectively oxidize faces having respectively different face orientations in a nitride semiconductor. Therefore, as shown in the aforementioned first to sixth embodiments, it is clearly confirmed that an oxide film is deeply formed in an area having crystal defects, and that a thick oxide film can be formed on the side face of a step difference. Here, the above embodiment has discussed a case in which faces having different face orientations in a nitride semiconductor are oxidized; however, the present invention is not intended to be limited by the nitride semiconductor, and can be applied to semiconductors in general.

Moreover, in view of these points, various oxidizing processes were carried out on the semiconductor devices in accordance with the first to seventh embodiments, and the results show that the thickness of an oxide film formed on the side face in the semiconductor layer except for the active layer becomes smaller than the thickness of the oxide film to be formed on the side face of the active layer. In this manner, since the thickness of the oxide film formed on the side face of the active layer is made thicker, it becomes possible to effectively prevent leak current on the side face of the active layer. Thus, it becomes possible to realize a semiconductor device having superior device characteristics.

Additionally, the present invention is effectively applied to a light-emitting element, such as a light-emitting diode and a semiconductor laser element, and a field-effect transistor that is operated in the order of the GHz.

What is claimed is:

1. A semiconductor device comprising:
   an active layer made of a first group III-nitride semiconductor layer formed on a substrate,
   crystal defects existing in the active layer, and
   oxidized layers formed on the active layer,
   wherein the oxidized layers are located separately from each other, each of the oxidized layers being formed selectively around each of the crystal defects, and
   a vertical size of each of the oxidized layers has a local maximum value at each of the crystal defects,
   wherein the local maximum value occurs only at one position of each of the oxidized layers, and
   the oxidized layers penetrate the active layer.

2. The semiconductor device according to claim 1, further comprising:
   a second semiconductor layer formed on the active layer,
   wherein an oxidized area is formed on at least one of a surface and a side face of the second semiconductor layer.

3. The semiconductor device according to claim 1, wherein the active layer is made of an activator layer of a light-emitting diode.

4. The semiconductor device according to claim 1, wherein the active layer is made of a light-absorbing layer of a photodiode.

5. The semiconductor device according to claim 1, wherein the active layer is made of a channel layer of a field-effect transistor.

* * * * *